US011774997B2

(12) United States Patent
Jung et al.

(10) Patent No.: US 11,774,997 B2
(45) Date of Patent: Oct. 3, 2023

(54) SEMICONDUCTOR DEVICE FOR GENERATING A REFERENCE CURRENT OR VOLTAGE IN VARIOUS TEMPERATURES

(71) Applicant: SK hynix Inc., Icheon-si (KR)

(72) Inventors: Jong Seok Jung, Icheon-si (KR); Chan Keun Kwon, Icheon-si (KR); Jong Seok Kim, Icheon-si (KR); Young Kwan Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/830,929

(22) Filed: Jun. 2, 2022

(65) Prior Publication Data
US 2023/0229185 A1  Jul. 20, 2023

(30) Foreign Application Priority Data
Jan. 20, 2022  (KR) .................. 10-2022-0008446

(51) Int. Cl.
*G05F 3/20* (2006.01)
*H03B 5/04* (2006.01)
*G01K 7/01* (2006.01)
*G05F 1/567* (2006.01)

(52) U.S. Cl.
CPC .............. *G05F 3/20* (2013.01); *G01K 7/01* (2013.01); *G05F 1/567* (2013.01); *H03B 5/04* (2013.01)

(58) Field of Classification Search
None
See application file for complete search history.

(56) References Cited

U.S. PATENT DOCUMENTS

| 5,614,816 | A | * | 3/1997 | Nahas | G05F 3/245 327/539 |
| 6,078,208 | A | * | 6/2000 | Nolan | G01K 7/01 327/512 |
| 7,102,395 | B2 | * | 9/2006 | Saito | G01R 19/16552 327/541 |
| 7,204,638 | B2 | * | 4/2007 | Hsu | G01K 7/01 374/163 |
| 7,331,708 | B2 | | 2/2008 | Blom et al. | |
| 7,420,358 | B2 | * | 9/2008 | Byeon | G05F 3/30 327/540 |
| 8,508,307 | B2 | * | 8/2013 | Mitsuda | H03K 3/011 327/539 |
| 8,947,067 | B1 | * | 2/2015 | Zarei | G05F 3/30 323/316 |
| 9,411,354 | B2 | * | 8/2016 | Hu | G05F 3/30 |

(Continued)

FOREIGN PATENT DOCUMENTS

| KR | 1020060075028 A | 7/2006 |
| KR | 100674974 B1 | 1/2007 |
| KR | 1020180032710 A | 4/2018 |

*Primary Examiner* — Thomas J. Hiltunen
(74) *Attorney, Agent, or Firm* — WILLIAM PARK & ASSOCIATES LTD.

(57) ABSTRACT

A bandgap reference circuit includes a plurality of current sources including different temperature coefficients, a first trimmer, and a mixer. The first trimmer adjusts current amounts for a plurality of currents, which are individually output from each of the plurality of current sources, to be equal to each other. The mixer adjusts an aggregate ratio and combines the plurality of currents based on the aggregate ratio.

15 Claims, 13 Drawing Sheets

(56) References Cited

U.S. PATENT DOCUMENTS

| | | | |
|---|---|---|---|
| 9,535,446 B2 * | 1/2017 | Glibbery | G05F 3/30 |
| 9,641,129 B2 * | 5/2017 | Coimbra | H03F 1/0205 |
| 10,120,399 B1 * | 11/2018 | Kamath | G06F 1/206 |
| 10,379,566 B2 | 8/2019 | Acar et al. | |
| 10,581,411 B2 | 3/2020 | Tanaka et al. | |
| 10,866,146 B2 | 12/2020 | Ippolito et al. | |
| 11,099,594 B1 * | 8/2021 | Kanoun | G05F 3/30 |
| 2006/0267127 A1 * | 11/2006 | Kim | G05F 3/30 |
| | | | 257/467 |

* cited by examiner

SEMICONDUCTOR DEVICE FOR GENERATING A REFERENCE CURRENT OR VOLTAGE IN VARIOUS TEMPERATURES

CROSS-REFERENCE TO RELATED APPLICATIONS

This patent application claims the benefit to Korean Patent Application No. 10-2022-0008446, filed on Jan. 20, 2022, the entire disclosure of which is incorporated herein by reference.

TECHNICAL FIELD

Various embodiments of the present disclosure described herein relate to a semiconductor device, and, more particularly, to an apparatus capable of generating a reference current or a reference voltage in various temperatures.

BACKGROUND

A semiconductor device may be designed to operate stably even with a change in PVT. Here, the change (or variation) in the PVT (Process, Voltage, Temperature) may include a process variation which is a phenomenon in which operation speeds of PMOS/NMOS transistors are different due to a cause in a manufacturing of the semiconductor device, a temperature variation which is another phenomenon in which the operations speeds of the PMOS/NMOS transistors varies depending on a temperature inside the semiconductor device, and a voltage variation which is another phenomenon in which the operation speeds of the PMOS/NMOS transistors changes according to a voltage or power supplied to the semiconductor device.

A bandgap reference circuit may be a kind of important components in analog and digital systems and be embedded and used as a reference voltage source or reference current source. A power supply voltage of analog and digital systems is getting lower for less power consumption, which is feasible due to manufacturing technology development, A bandgap reference circuit included in the analog and digital systems can operate at a low voltage to compensate for the change of temperature.

BRIEF DESCRIPTION OF THE DRAWINGS

The description herein makes reference to the accompanying drawings wherein like reference numerals refer to like parts throughout the figures.

DETAILED DESCRIPTION

Figure 1:
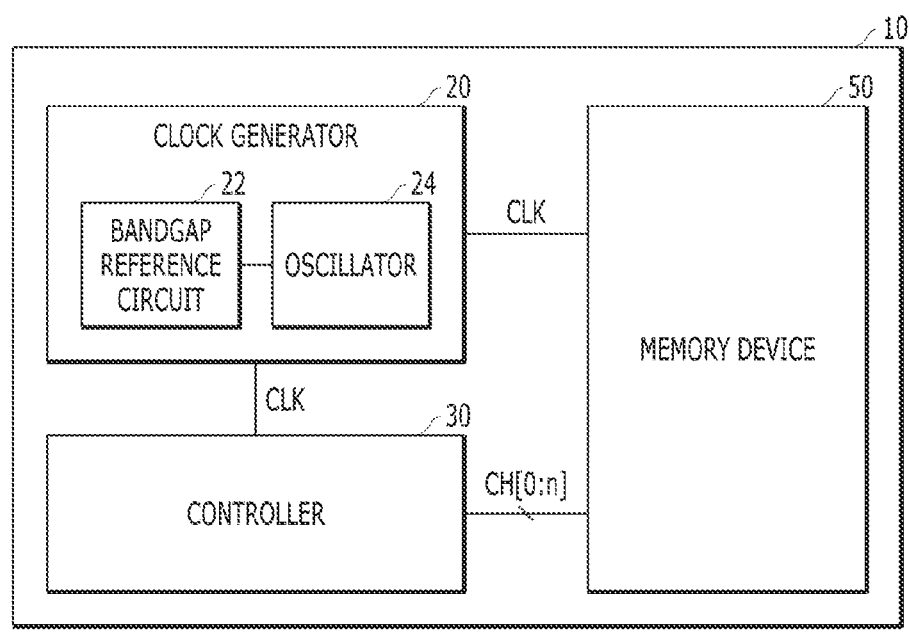
FIG. 1 illustrates a memory system according to an embodiment of the present disclosure.

Various embodiments of the present disclosure are described below with reference to the accompanying drawings. Elements and features of the disclosure, however, may be configured or arranged differently to form other embodiments, which may be variations of any of the disclosed embodiments.

NOM In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these ter specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.), The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a foe, a portion of the file, a page in memory, an object in an object-oriented program, a digital message, a digital scanned image, a part of a video or audio signal, metadata or any other entity which can be represented by a sequence of bits. According to an embodiment, the data item may include a discrete object, According to another embodiment, the data item may include a unit of information within a transmission packet between two different components.

An embodiment of the present disclosure can provide a circuit or a device supporting a stable operation by compensating for a temperature change inside a semiconductor device. In addition, in an embodiment, the semiconductor device compensating for the temperature change can provide a memory system or a data processing system which is capable of safely protecting and rapidly handling data stored in a memory device.

Embodiments of the present disclosure can provide a bandgap reference circuit, a dock signal generator including the bandgap reference circuit, a power circuit including the bandgap reference circuit, a semiconductor device including the clock signal generator or the power supply circuit, a memory system including the semiconductor device, and a data processing apparatus including the memory system.

In an embodiment, a bandgap reference circuit can include a plurality of current sources having different temperature coefficients; a first trimmer configured to adjust current amounts of a plurality of currents, which are individually output from each of the plurality of current sources, to be equal to each other; and a mixer configured to adjust an aggregate ratio and combine the plurality of currents based on the aggregate ratio.

The plurality of current sources can include a first current source configured to decrease a current amount of a first current among the plurality of currents; and a second current source configured to increase a current amount of a second current among the plurality of currents.

The first current source can include plural diodes, plural diode-connected transistors, or plural bipolar junction transistors (BJTs), The second current source can output a difference between currents flowing through two components having different sizes in the first current source.

The first trimer can adjust an amount of the first current output from the first current source.

The bandgap reference circuit can further include a comparator configured to compare a second current output from one of the plurality of current sources with a first current output through the first trimmer. An adjustment, performed by the first trimmer, for at least one current amount for the plurality of currents can be monitored at a first temperature based on a comparison result of the comparator.

The mixer can adjust current amounts for the plurality of currents at a second temperature, which is different from the first temperature, to be equal to each other. The mixer can include a second trimer configured to adjust a current amount of the first current at the second temperature; a third trimer configured to adjust a current a mount of the second current at the second temperature; and a combiner configured to combine outputs of the second trimer and the third trimer.

The bandgap reference circuit can further include a fourth trimer configured to adjust a current amount of current output from the mixer based on a preset reference. The word "preset" as used herein with respect to a parameter, such as a preset reference, preset period, preset to function or purpose, and preset range, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In another embodiment, a clock signal generator can include a bandgap reference circuit configured to adjust current amounts of a plurality of currents, which are individually output from each of the plurality of current sources having different temperature coefficients, to be equal to each other, adjust an aggregate ratio, and combine the plurality of currents based on the aggregate ratio to output a combined current as a reference current; and an oscillator configured to generate a clock signal based on the reference current.

The plurality of current sources can include a first current source configured to decrease an amount of a first current among the plurality of currents; and a second current source configured to increase a current amount of a second current among the plurality of currents.

The bandgap reference circuit can include a first trimmer configured to adjust a current amount of the first current output from the first current source according to a current amount of the second current; and a mixer configured to adjust an aggregate ratio and combine the first current and the second current based on the aggregate ratio.

The bandgap reference circuit can further include a comparator configured to compare a second current output from one of the plurality of current sources with a first current output through the first trimmer. An adjustment, performed by the first trimmer, for at least one current amount for the plurality of currents can be monitored at a first temperature based on a comparison result of the comparator.

The mixer can adjust the current amounts of the plurality of currents at a second temperature, which is different from the first temperature, to be equal to each other. The mixer can include a second trimmer configured to adjust the current amount of the first current at the second temperature; a third trimmer configured to adjust the current amount of the second current at the second temperature; and a combiner configured to combine outputs of the second trimmer and the third trimmer.

The bandgap reference circuit can further include a fourth trimmer configured to adjust a current amount of current output from the mixer based on a preset reference.

In another embodiment, a power circuit can include a bandgap reference circuit configured to adjust voltage levels of a plurality of voltages, which are individually output from each of a plurality of voltage sources having different temperature coefficients, to be equal to each other, adjust an aggregate ratio, and combine the plurality of voltages based on the aggregate ratio to output a combined voltage as a reference voltage; and a regulator configured to receive an external power voltage to generate an internal power supply voltage based on the reference voltage.

The plurality of voltage sources can include a first voltage source configured to decrease a voltage level of a first voltage among the plurality of voltages; and a second voltage source configured to increase a voltage level of a second voltage among the plurality of voltages.

The bandgap reference circuit can include a first trimmer configured to adjust a voltage level of the first voltage output from the first voltage source according to a voltage level of the second voltage; and a mixer configured to adjust an aggregate ratio and combine the first voltage and the second voltage based on the aggregate ratio.

The bandgap reference circuit can further include a comparator configured to compare a second voltage output from one of the plurality of voltage sources with a first voltage output through the first trimmer. An adjustment, performed by the first trimmer, for at least one voltage among the plurality of voltages can be monitored at a first temperature based on a comparison result of the comparator.

The mixer can adjust the voltage levels of the plurality of voltages at a second temperature, which is different from the first temperature, to be equal to each other. The mixer can include a second trimmer configured to adjust a voltage level of the first voltage at the second temperature; a third trimmer configured to adjust a voltage level of the second voltage at the second temperature; and a combiner configured to combine outputs of the second trimmer and the third trimmer.

The bandgap reference circuit can further include a fourth trimmer configured to adjust a voltage level of voltage output from the mixer based on a preset reference.

The power circuit can further include a voltage sensor configured to monitor whether a voltage level of the internal power supply voltage is below a present level.

Embodiments of the present disclosure will now be described with reference to the accompanying drawings, wherein like numbers reference like elements.

FIG. 1 illustrates a memory system according to an embodiment of the present disclosure.

Referring to FIG. 1, a memory system 10 can include a controller 30 and a memory device 50. Also, the memory system 10 can include a clock signal generator 20.

According to an embodiment, the memory device 50 and the controller 30 can be functionally separated components included in a single chip or a single board. Also, according to another embodiment, the memory device 50 and the controller 30 can be implemented through one semiconductor device chip or a plurality of semiconductor device chips. According to another embodiment, in a case when it is required that the memory system 10 is manufactured with a high degree of integration, the memory device 50 and the controller 30 can be implemented in a single semiconductor device chip.

The controller 30 and the memory device 50 can be coupled through at least one data path. For example, a data path can include a channel CH[0:n] or a way. In addition, the data path can be configured with a plurality of lines to transmit/receive plural data items at the same time. The controller 30 can control and manage an operation for storing data in the memory device 50 or outputting data stored in the memory device 50.

The memory device 50 can include a plurality of nonvolatile memory cells or a plurality of volatile memory cells. The memory device 50 can include at least one die including plural memory cells. The memory device 50 may include a data transmission/reception circuit for performing data communication with the controller 30. For example, the controller 30 and the memory device 50 can support an Open NAND Flash Interface (ONFi), a toggle mode, and the like for data transmission. For example, the ONFi can use a data path (e.g., a channel, a way, etc.) including a signal line capable of supporting bidirectional transmission/reception of 8-bit or 16-bit data item. Data communication between the controller 30 and the memory device 50 can be performed through an interface to at least one of an asynchronous single data rate (SDR), a synchronous double data rate (DDR), and a toggle double data rate (DDR).

The dock signal generator 20 can supply a dock signal CLK into the controller 30 and the memory device 50. According to an embodiment, the dock signal generator 20 can receive a clock signal from an external device and then modulate or modify the received dock signal to output the clock signal CLK. According to another embodiment, when power is applied without receiving a dock signal from an external device, the dock signal generator 20 can generate and output the dock signal CLK, Referring to FIG. 1, the dock signal generator 20 is separated from the controller 30. However, according to another embodiment, the clock signal generator 20 can be included in the controller 30.

The dock signal CLK may be used as a reference for performing an operation in the controller 30 and the memory device 50. For example, when the controller 30 transmits data to the memory device 50, the data can be transmitted every cycle, or the data may be transmitted every half cycle in response to the clock signal CLK. When the memory device 50 performs an operation to read or store data, an operation margin for the operation may be set based on a clock cycle (e.g., 3 cycles, 4 cycles, . . . , 10 cycles, etc.). The clock signal CLK can affect a margin or speed of an operation performed in the memory system 10, activation or deactivation of the operation, and the like.

The memory system 10 is a type of semiconductor device which may be affected by change or variation in a process, a voltage, and a temperature (PVT). In an embodiment, in order for the memory system 10 to stably operate even with the change or variation in the PVT, the dock signal CLK output from the dock signal generator 20 should be stable and consistent even with the change in the PVT. For generating a stable dock signal CLK, in an embodiment, the dock signal generator 20 may include a to bandgap reference circuit 22 and an oscillator 24.

In an embodiment, the bandgap reference circuit 22 can output a reference current or a reference voltage used for generating a stable and consistent clock signal CLK even with the change in the PVT. The oscillator 24 can output the clock signal CLK having a preset period based on the reference current or the reference voltage output from the bandgap reference circuit 22. Internal configuration and operation of the clock signal generator 20 is described later with reference to FIGS. 3 and 10.

Figure 2:
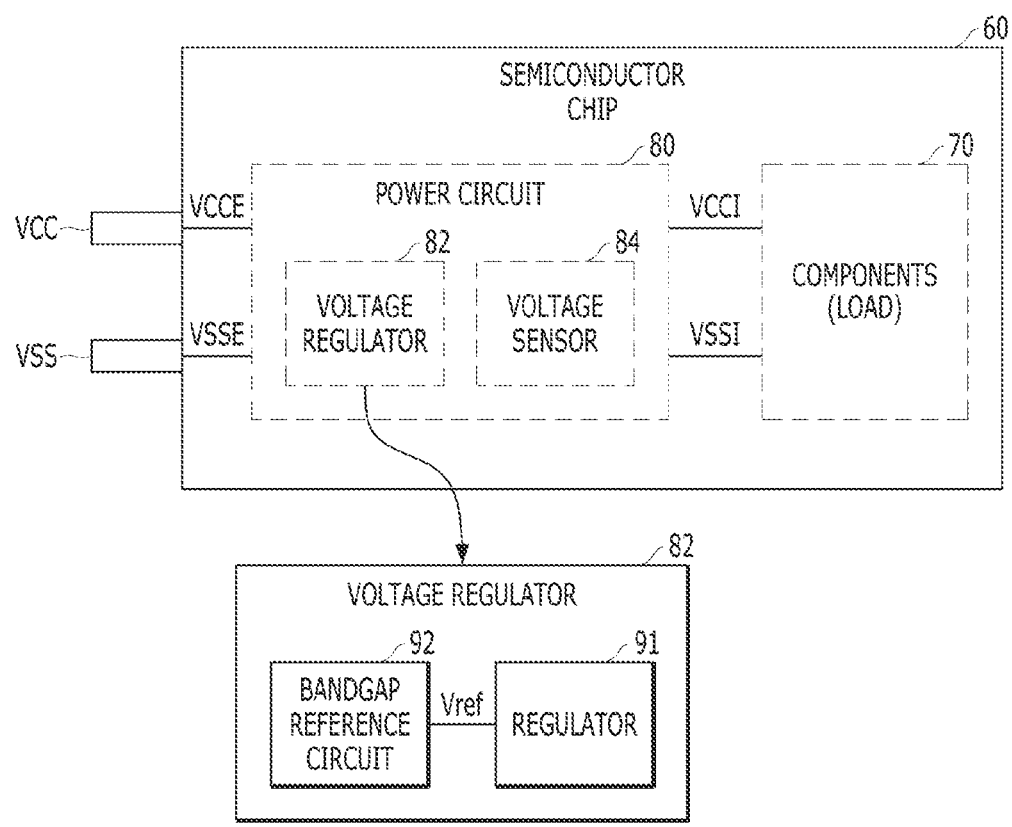
FIG. 2 illustrates a semiconductor device according to another embodiment of the present disclosure.

FIG. 2 illustrates a semiconductor device according to another embodiment of the present disclosure.

Referring to FIG. 2, a semiconductor device chip 60 can include electrical elements and circuits to perform a specific function. The semiconductor device chip 60 can include a plurality of pins or pads, and can receive or output a power voltage, a data item, a command, or various control signals through the plurality of pins or pads. The circuits or electrical elements included in the semiconductor device chip 60 may vary depending on a design purpose, and the number of a plurality of pins or pads included in the semiconductor device chip may also vary depending on a design. For example, the memory system 10, the memory device 50, or the controller 30 shown in FIG. 1 can be implemented in the semiconductor device chip 60.

The plurality of pins or pads may be used according to a preset function or purpose. For example, when a specific pin or pad among the plurality of pins or pads is set to be used for data input/output, an electrical signal corresponding to the data item (e.g., a waveform or a potential within a specific voltage range) is transmitted to the corresponding pin or pad. Also, when a power voltage is supplied to a specific pin or pad, the specific pin or pad may be used to receive a power voltage used for operation of internal components included in the semiconductor device chip 60.

In an embodiment, a semiconductor device such as a memory system or a processor which satisfies a user's needs may be developed to operate at a higher speed and consume less power. The semiconductor device chip 60 can include plural circuits or modules to perform various functions. When a plurality of circuits, modules, or components that perform a plurality of functions are formed in plural different semiconductor device chips, delay and noise may occur in the process of transferring data and signals between circuits, modules or components of the plural different semiconductor device chips, so that operation performance of the memory system or the processor may be degraded. In an embodiment, the semiconductor device chip 60 may be designed to include various circuits, modules, or components, thereby improving performance of the semiconductor device and increasing an integration degree of the semiconductor device.

As a plurality of circuits, modules, or components are included in the single semiconductor device chip 60, a change of electrical loads inside the semiconductor device chip 60 may increase. Referring to FIG. 2, a power voltage VCC and a ground voltage VSS may be supplied through a plurality of pins or pads included in the semiconductor device chip 60 to operate the plurality of circuits, modules, or components included in the semiconductor device chip 60. The semiconductor device chip 60 can include a power circuit 80 that outputs an internal power supply voltage VCCI and an internal ground voltage VSSI, and a component 70 driven by the internal power supply voltage VCCI and the internal ground voltage VSSI. The power circuit 80 can generate the internal power supply voltage VCCI and the internal ground voltage VSSI based on an external power voltage VCCE and an external ground voltage VSSE supplied through at least one pin or pad.

The power circuit 80 can include a voltage regulator 82 and a voltage sensor 84. The voltage regulator 82 can be used to supply stable power to an electronic device such as the memory system 10. Generally, the voltage regulator 82 may be classified into a linear regulator and a switching regulator. An example of the switching regulator can be a DC-DC converter, Although the DC-DC converter can have high conversion efficiency, the output voltage of the DC-DC converter may include a lot of noise compared to that of the linear regulator. An example of a linear regulator can be a low-dropout (LDO) regulator. In an embodiment, the LDO regulator may have low conversion efficiency. But, in another embodiment, the LDO regulator can have a fast response speed. In an embodiment, the output voltage of the LDO regulator can include a smaller amount of noise compared to that of the DC-DC converter. In an embodiment, the LDO regulator can be applicable to a noise-sensitive device or a device which should be driven with high performance. For example, in an embodiment the LDO regulator, which can compensate for the disadvantages of the DC-DC converter, can be applicable to the memory system 10 operating at a high speed. The voltage regulator 82 can output the internal power supply voltage VCCI based on the external power voltage VCCE.

According to an embodiment, the component 70 described in FIG. 2 can include the memory device 50 shown in FIG. 1. For example, the memory device 50 including non-volatile memory cells can include plural memory blocks and a voltage supply circuit, According to an operation performed through the memory blocks and the voltage supply circuit, electrical loads of the component 70 may vary. Further, according to an embodiment, the component 70 can include at least one module or circuit included in the controller 30. When an overload or an overcurrent occur due to a structure or an operation of the component 70, a change of the internal power supply voltage VCCI or the internal ground voltage VSSI can occur.

The voltage sensor 84 may detect a change of the internal power supply voltage VCCI or the internal ground voltage VSSI. Due to the operation of the component 70, a phenomenon in which the internal ground voltage VCCI is changed or fluctuated at a specific position inside the semiconductor device chip 60 may occur. The power supplied into the component 70 may be determined based on a voltage difference between the internal ground voltage VSSI and the internal power supply voltage VCCI, However, when the internal ground voltage VSSI is not maintained at a level of 0V but is fluctuated or changed in a range of −500 mV to 500 mV or more, the power supplied into the component 70 may exceed a preset range.

When the voltage regulator 82 generates the internal power supply voltage VCCI regardless of fluctuation of the internal ground voltage VSSI, a level of the internal power supply voltage VCCI, which is even appropriately output from the voltage regulator 82, might not be supplied with the preset range into the component 70. For example, when the voltage regulator 82 outputs the internal power supply voltage VCCI of 5V based on the external ground voltage VSSE but the internal ground voltage VSSI becomes 1V, the power supplied into the component 70 is a voltage of 4V based on the voltage difference between the internal power supply voltage VCCI and the internal ground voltage VSSI, Substantially, in an embodiment, when a voltage of 4V is supplied into the component 70 of the semiconductor device chip 60, an operation of the component 70 may become unstable.

The voltage regulator 82 according to an embodiment may generate the internal power supply voltage VCCI in response to the internal to ground voltage VSSI. For example, the voltage regulator 82 can output the internal power supply voltage VCCI based on a sum of a reference voltage Vref, which is independent from a change of the external power voltage VCCE, and the internal ground voltage VSSI which is fluctuated or changed environmentally by the component 70, Herein, an environmental change may include change or variations of the process, the voltage, and the temperature (e.g., Process-Voltage-Temperature (PVT) variations) in the semiconductor device chip 60. For example, the voltage regulator 82 may include an adder circuit capable of summing the reference voltage Vref and the internal ground voltage VSSI, In a process of outputting the internal power supply voltage VCCI based on the sum of the reference voltage Vref and the internal ground voltage VSSI, the voltage regulator 82 can track a change of the internal ground voltage VSSI and stably supply the internal power supply voltage VCCI into the component 70.

Referring to FIG. 2, the voltage regulator 82 capable of outputting a stable internal power supply voltage VCCI even with the change of the PVT can include a bandgap reference circuit 92 and a regulator 91. For example, in an embodiment, the bandgap reference circuit 92 can output the reference voltage Vref having a stable level even though the change of the PVT occurs, and the regulator 91 can output the internal power supply voltage VCCI based on the reference voltage Vref output from the bandgap reference circuit 92.

According to an embodiment, an apparatus such as the power to circuit 80 may be applicable to the memory system 10 including the non-volatile memory device 50. Also, according to another embodiment, the power circuit may be applicable to a volatile memory device or a memory system including the volatile memory device. The power circuit 80 may also be applicable to a processor, a system IC, or the like which is designed for a specific purpose.

Figure 3:
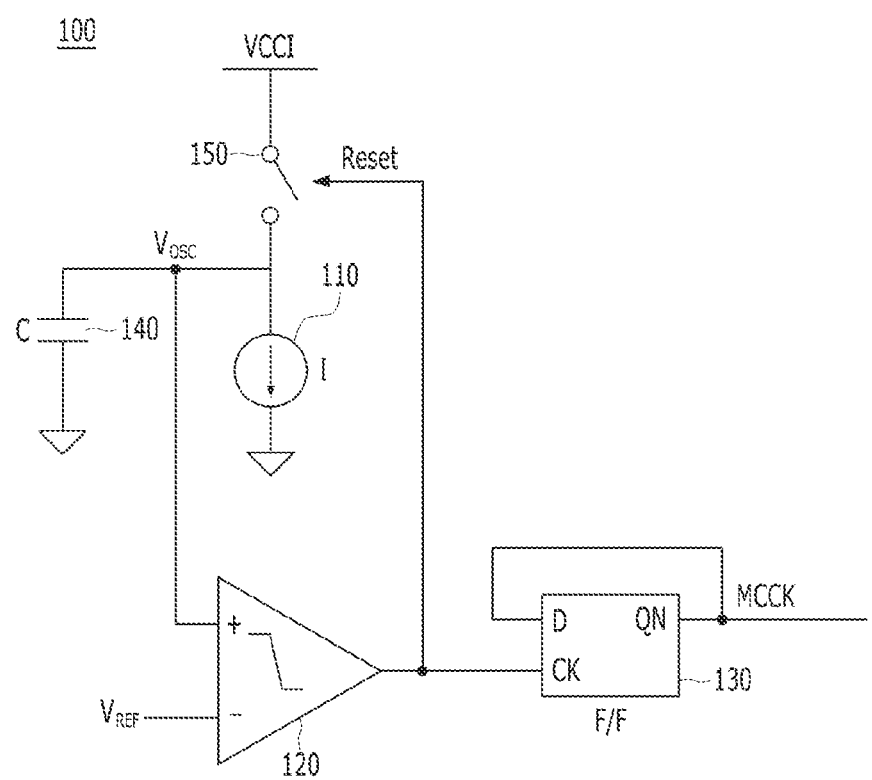
FIG. 3 illustrates a dock signal generator according to another embodiment of the present disclosure.

FIG. 3 illustrates a clock signal generator according to another embodiment of the present disclosure.

Referring to FIG. 3, a clock signal generator 100 can include a relaxation oscillator to generate a clock signal CLK used in the memory system 10 described with reference to FIG. 1. The relaxation oscillator can generate a non-sine wave signal such as a triangular wave signal, etc., instead of a sine wave signal such as a square wave signal. For example, when the internal power supply voltage VCCI is applied to the clock signal generator 100, a current I can flow through an enable device 150 and a current source 110 so that an oscillation voltage $V_{OSC}$ at a node connected to the capacitor C 140 can be generated.

The comparator 120 can compare the oscillation voltage $V_{OSC}$ with a reference voltage $V_{REF}$, to output a comparison result. In response to the comparison result of the comparator 120, a reset signal Reset is determined. The enable device 150 can be turned off or on by a reset signal Reset. In addition, the comparison result of the comparator 120 is input to a clock terminal CK of the flip-flop (F/F) 130, Because the input terminal D and the output terminal QN of the flip-flop (F/F) 130 are connected to each other through a feedback loop, the flip-flop (F/F) 130 can repeatably invert an output result in response to the comparison result of the comparator 120. For example, an output result MCCK of the flip-flop (F/F) 130 can be repeatably changed from a logic low level to a logic high level, or vice versa. The output result MCCK can be used as the clock signal CLK.

Figure 4:
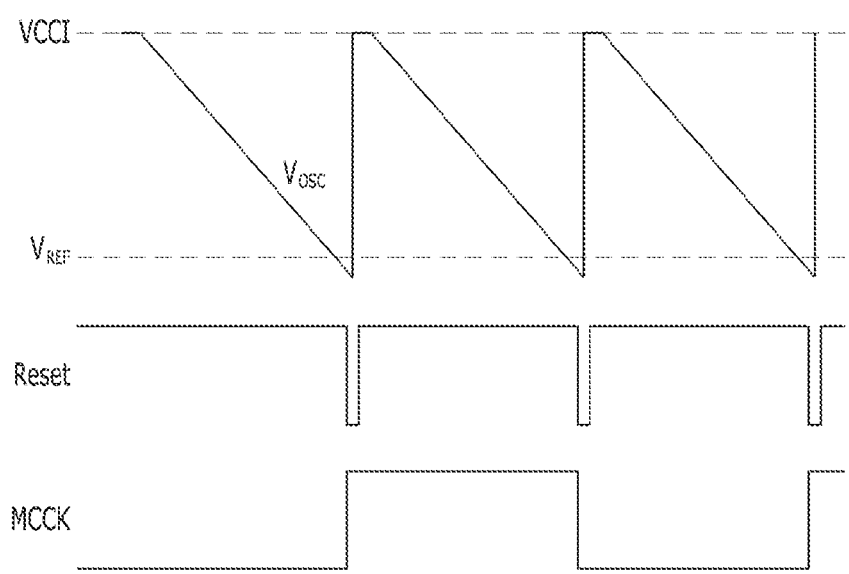
FIG. 4 describes an operation of the dock signal generator illustrated in FIG. 3.

FIG. 4 describes an operation of the clock signal generator illustrated in FIG. 3.

Referring to FIGS. 3 and 4, when the internal power supply voltage VCCI is supplied, a current can flow through a path corresponding to the enable element 150 and the current source 110. When the current flows, the capacitor 140 can be charged. As the capacitor 140 becomes charged with charges, a level of the oscillation voltage $V_{OSC}$ is changed.

The comparator 120 may compare the oscillation voltage $V_{OSC}$ and the reference voltage $V_{REF}$ The reference voltage $V_{REF}$ has a stable and constant voltage level, but the level of the oscillation voltage $V_{OSC}$ varies. When the level of the oscillation voltage $V_{OSC}$ changes and becomes lower than the constant voltage level of the reference voltage $V_{REF}$, the comparator 120 can change the comparison result of the comparator 120. The comparison result of the comparator 120, as the reset signal Reset, can control the enable device 150. When the enable device 150 is turned off by the reset signal Reset, the level of the oscillation voltage $V_{OSC}$ can increase due to charges charged in the capacitor 140 and become higher to than the level of the reference voltage $V_{REF}$. When the comparison result of the comparator 120 changes, the reset signal Reset changes. When the internal power supply voltage VCCI is supplied and the enable device 150 is turned on, the level of the oscillation voltage $V_{OSC}$ changes again.

The reset signal Reset is applied to the clock terminal CK of the flip-flop (F/F) 130, and the flip-flop (F/F) 130 may invert the output result MCCK in response to the reset signal Reset. The output result MCCK of the flip-flop (F/F) 130 can be used as the clock signal CLK.

Figure 5:
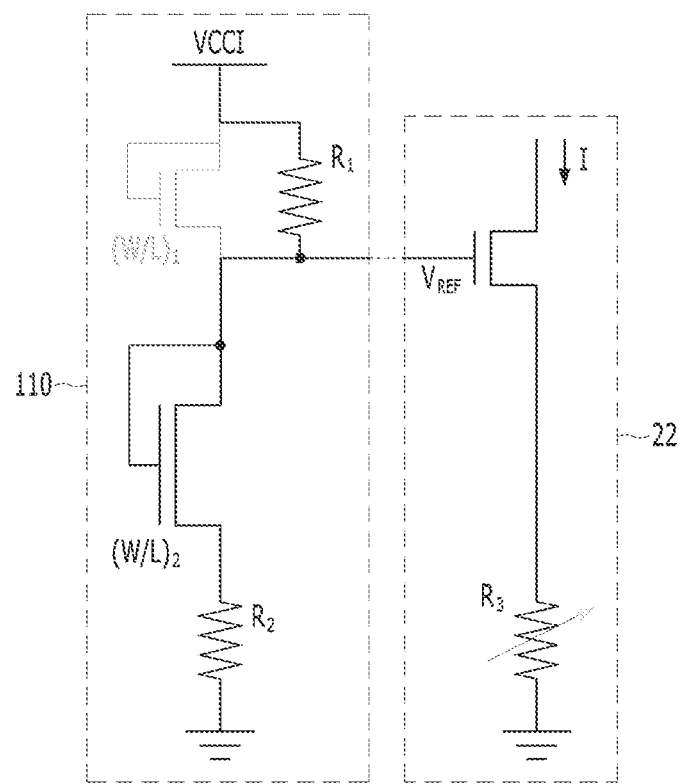
FIG. 5 illustrates a current source shown in FIG. 3.

FIG. 5 illustrates a current source shown in FIG. 3.

In an embodiment, the structure of the relaxation oscillator included in the clock signal generator 100 described in FIG. 3 can generate a stable (or regular) oscillation voltage $V_{OSC}$ even with the change of temperature. For this purpose, the clock signal generator 100 could have a circuit or a structure for compensating for internal resistance change according to the change of temperature to generate a fixed (or constant) voltage or current regardless of the temperature change.

A resistance included in the current source 110 disposed between the internal power supply voltage VCCI and the ground voltage can be expressed as described with reference to FIG. 5, The resistance of the current source 110 or other devices disposed between the internal power supply voltage (VCCI) and the ground voltage can be considered the first resistor R1, a variable $(W/L)_2$ based on the change of process, and the second resistor R2. For example, variations in W and L can be caused by a to lithographic process. These variations are not correlated because W is determined in the field oxide step while L is defined in the poly and source/drain diffusion steps. The comparator 120 can compare the oscillation voltage $V_{OSC}$, which is changed by the current source 110 disposed between the internal power supply voltage VCCI and the ground voltage, with the reference voltage $V_{REF}$ output from the bandgap reference circuit 22.

The resistances of the first resistor $R_1$ and the second resistor $R_2$ can vary according to the change of temperature. To reduce an effect caused by the change of temperature, a compensation value for the change of temperature can be determined by a resistance of the third resistor $R_3$ included in the bandgap reference circuit 22.

With respect to the oscillator 24 in the clock signal generator 20, the change of resistances of the first resistor $R_1$ and the second resistor $R_2$ according to the change of temperature can be monitored or checked. For example, the resistances of the first resistor $R_1$ and the second resistor $R_2$ can be calculated at different temperatures (e.g., 70 degrees, 60 degrees, 50 degrees, 40 degrees, etc.). Based on calculated resistances at different temperatures in a temperature range where, in an embodiment, it is guaranteed that the memory system 10 including the dock signal generator 100 operates stably, the compensation value for the change of temperature change can be determined. In an embodiment, if the memory system 10 should be able to stably perform an operation in a temperature range of minus 30 degrees Celsius (−30° C.) to 100 degrees Celsius (100° C.), the corresponding temperature range may be divided into at least one preset range, and a compensation value according to the temperature change in the at least one preset range can be tracked. In an embodiment, when the third resistor reflecting the obtained compensation value is determined, the clock signal generator 100 can generate a stable clock signal CLK even with the change of temperature.

Figure 6:
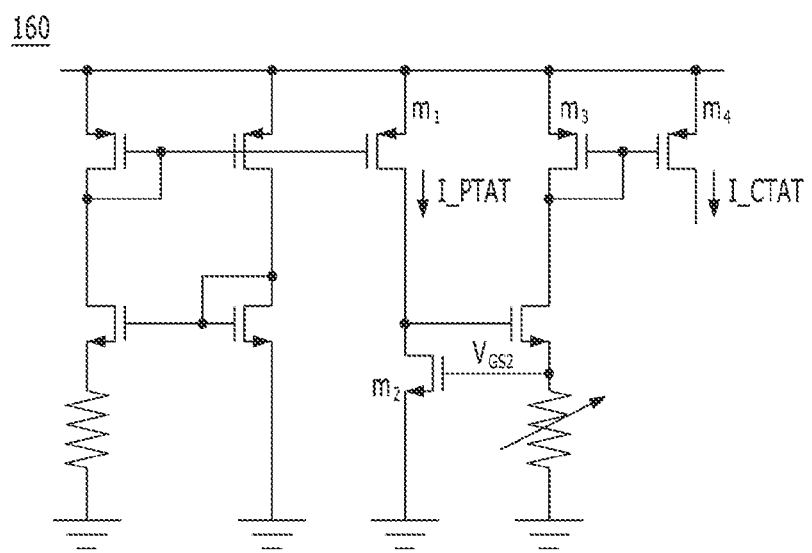
FIG. 6 illustrates a reference current generator including a plurality of current sources having different temperature trends, FIG. 7 describes an operation of the reference current generator shown in FIG. 6.

FIG. 6 illustrates a reference current generator including a plurality of current sources having different temperature trends.

Referring to FIG. 6, a reference current generator 160 can include a plurality of current sources having different temperature coefficient. The plurality of current sources can include plural components having different current densities m1, m2, m3, m4, A gate-source voltage $V_{GS2}$ can be adjustable by a variable resistor. For example, two currents generated by the reference current generator 160 can include a first current I_PTAT and a second current I_CTAT, The Widlar current source, for example, nay be used as a current source for generating the first current (I_PTAT), and has a tendency to be insensitive to the change of a power supply voltage level, but can have a characteristic proportional to the temperature (e.g., Proportional To Absolute Temperature, called PTAT). Further, a constant current source circuit, which is a current source for generating the second current I_CTAT, has a tendency to be insensitive to the change of the power supply voltage level, but has a characteristic complementary to absolute temperature (CTAT). By adding the first current I_PTAT and the second current I_CTAT having different characteristics in response to the change of temperature, a tendency according to the change of temperature can be adjusted. An example of how to adjust the tendency according to the change of temperature is described with reference to FIG. 7.

Figure 7:
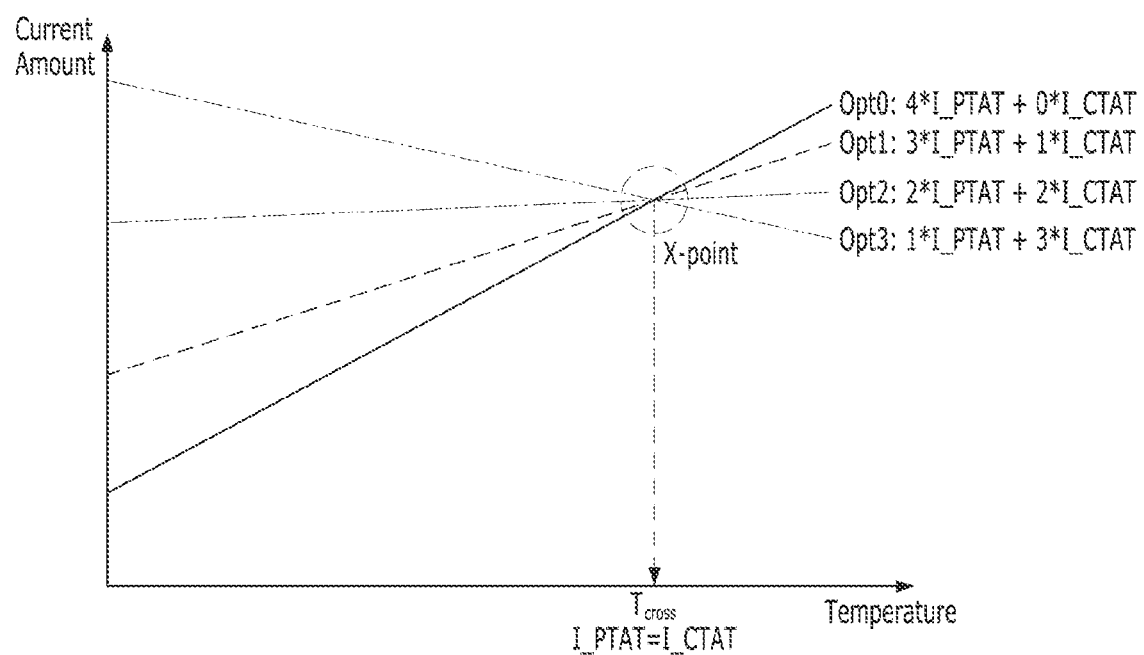

FIG. 7 describes an operation of the reference current generator shown in FIG. 6.

Referring to FIG. 7, when the first current I_PTAT and the second current I_CTAT generated by the reference current generator 160 can be adjusted by various weightings, different results depending on the change of temperature can be obtained.

In FIG. 7, four examples are described. First, a first result according to a first option Opt0 can be obtained by adding a value, obtained by multiplying the first current I_PTAT by 4, and another value obtained by multiplying the second current I_CTAT by 0. A second result according to a second option Opt1 can be obtained by adding a value, obtained by multiplying the first current I_PTAT by 3, and another value obtained by multiplying the second current I_CTAT by 1, A third result according to a third option 0pt2 may be obtained by adding a value obtained by multiplying the first current I_PTAT by 2 and another value obtained by multiplying the second current I_PTAT by 2, A fourth result according to a fourth option Opt3 can be obtained by adding a value obtained by multiplying the first current I_PTAT by 1 and another value obtained by multiplying the second current I_PTAT by 3. There may be a temperature Tcross at which the first to fourth results according to the first option Opt0 to the fourth option 0pt3 intersect X-point. The temperature Tcross at which the first to fourth results according to the first option Opt0 to the fourth option 0pt3 intersect can be considered a temperature at which the first current I_PTAT and the second current I_CTAT have the same amount (i.e., I_PTAT=I_CTAT).

The reference current generator 160 can perform addition of the first current I_PTAT and the second current I_CTAT as well as curvature correction simultaneously, so that the number of operational amplifiers and current mirrors included in the reference current generator 160 can be reduced. When the number of operational amplifiers and current mirrors decreases, the change of process for fabricating the reference current generator 160 could be reduced. However, when the temperature Tcross at which the first to fourth results according to the first option Opt0 to the fourth option 0pt3 intersect is not constant according to the change of process, it may be difficult, in an embodiment, to embed the reference current generator 160 in a semiconductor device or a memory system. In order to overcome this issue, in an embodiment, a variable resistor can be included in the reference current generating device 160.

Figure 8:
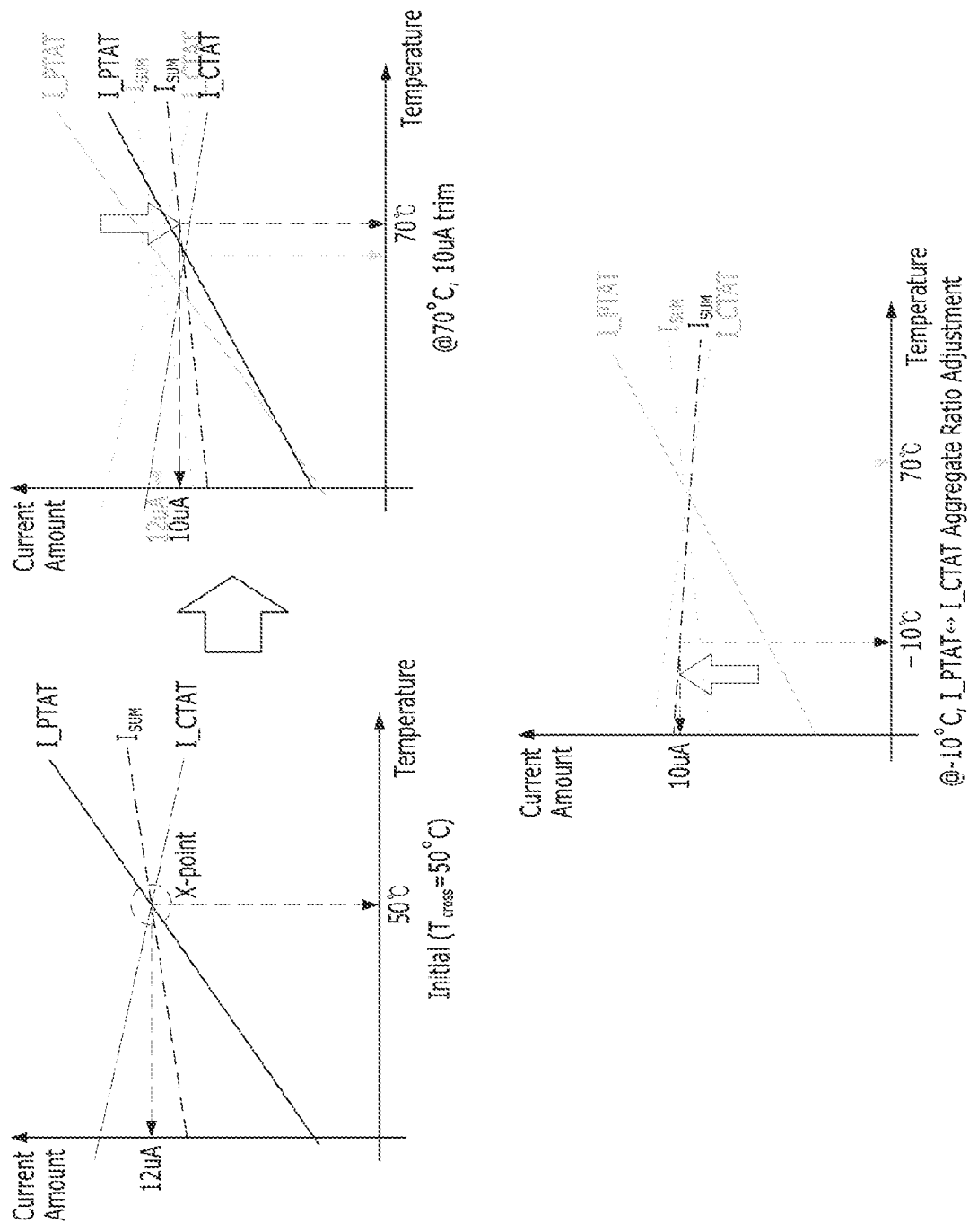
FIG. 8 describes temperature-specific characteristics of the reference current generator shown in FIG. 6.

FIG. 8 describes temperature-specific characteristics of the reference current generator shown in FIG. 6.

Referring to FIG. 8, a temperature Tcross at which the amounts of the first current I_PTAT and the second current I_CTAT generated by the reference current generator are equal to each other (e.g., 12 µA) may be at 50 degrees (50° C.). Thereafter, a temperature of the environment in which the reference current generator operates can be changed. Combination $I_{SUM}$ of the first current I_PTAT and the second current I_CTAT adjusted according to the change of temperature (e.g., a different temperature of 70 degrees, 70° C.) can be about 10 µA. Based on a difference between the first currents I_PTAT and the second currents I_CTAT at 50 degrees (50° C.) and 70 degrees (70° C.), a tendency for the change of temperature may be estimated. Thereafter, the temperature of the environment in which the reference current generator operates can be adjusted again (e.g., minus 10 degrees, −10° C.). At a different temperature (−10° C.), a compensation value for adjustment in the first current I_PTAT and the second current I_CTAT can be determined.

When compensation values at plural temperatures are monitored or checked in the operational environment and the tendency for the change of temperature might be constant, the reference current generator could easily generate a reference current having a constant amount even with the change of temperature, as compared to when the tendency for the change of temperature is not constant after monitoring or checking the compensation values at the plural temperatures. It is because it might be difficult for the reference current generator to generate the reference current having the constant amount even with the change of temperature.

As described in FIG. 7, in an embodiment, even though a variable resistor can be included in the reference current generator to counteract the change of temperature, it might be difficult to generate the reference current having a constant amount even with the change of temperature when the tendency for the change of temperature is not constant. Further, the compensation value corresponding to the change of temperature can vary due to the change of process (e.g., fabrication or manufacturing process) for the reference current generator.

Figure 9:
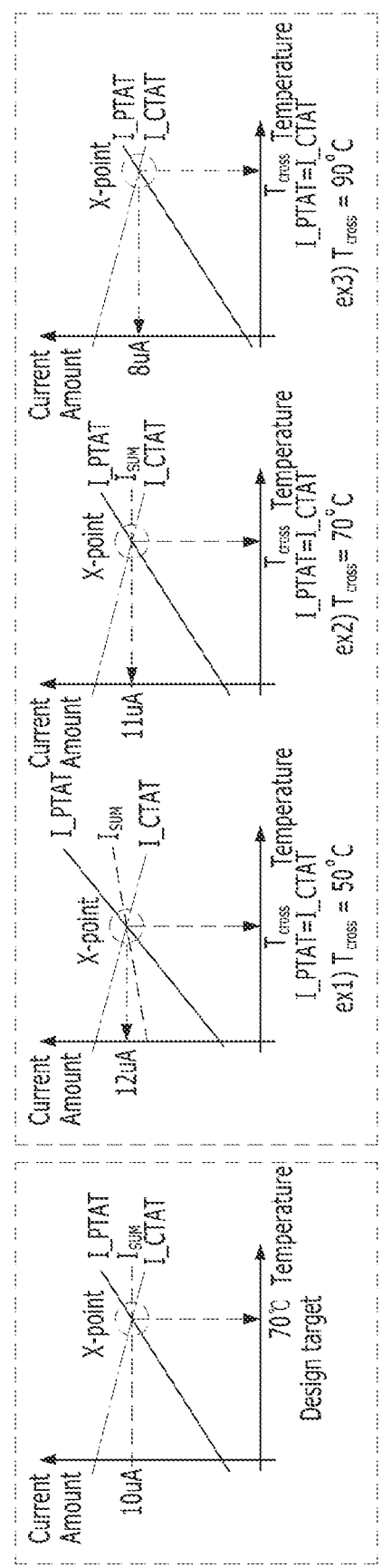
FIG. 9 describes that compensation for a temperature change to of the reference current generator shown in FIG. 6 varies according to a change in a manufacturing process.

FIG. 9 describes that compensation for a temperature change of the reference current generator shown in FIG. 6 varies according to a change in a manufacturing process.

Referring to FIG. 9, a compensation value for the change of temperature can be estimated when designing and manufacturing a reference current generator. For example, the reference current generator can be designed such that amounts of the first current I_PTAT and the second current I_CTAT are equal to 10 μA at a specific temperature (e.g., 70 degrees), However, the amounts of the first current PTAT and the second current I_CTAT might be different from a designed value because of the change of process (e.g., fabrication or manufacturing process) for the reference current generator.

For applying the compensation value, the amount of the first to current I_PTAT or the second current I_CTAT might be trimmed. For example, after the reference current generator is manufactured, the amounts of the first current I_PTAT and the second current I_CTAT can be equal to each other (e.g., 12 μA) at a different temperature (e.g., 50 degrees). In another example, after the reference current generator is manufactured, the amounts of the first current I_PTAT and the second current I_CTAT can be equal to each other (e.g., 11 μA) at another temperature (e.g., 70 degrees). In another example, after the reference current generator is manufactured, the amounts of the first current I_PTAT and the second current I_CTAT can be equal to each other (e.g., 8 μA) at another temperature (e.g., 90 degrees). Various above-described cases in which a designed amount is not obtained at a target temperature might occur due to the change of process (e.g., fabrication or manufacturing process) for the reference current generator.

Accordingly, in an embodiment of the present disclosure, the reference current generator can have a structure in order to accurately set a compensation value in response to the change of temperature. The structure, in an embodiment, is for accurately reflecting the tendency regarding the first current I_PTAT and the second current I_CTAT for the change of temperature. In the embodiment, the reference current generator can include a first trimer or adjustment means for making amounts of the first current I_PTAT and the second current I_CTAT equal, a second trimer or adjustment means for adjusting weights for the first current I_PTAT and the second current I_PTAT before the first current I_PTAT and the second current I_PTAT are combined, and a third trifler or adjustment means for adjusting an amount of a combined current of the first current I_PTAT and the second current I_CTAT.

Figure 10:
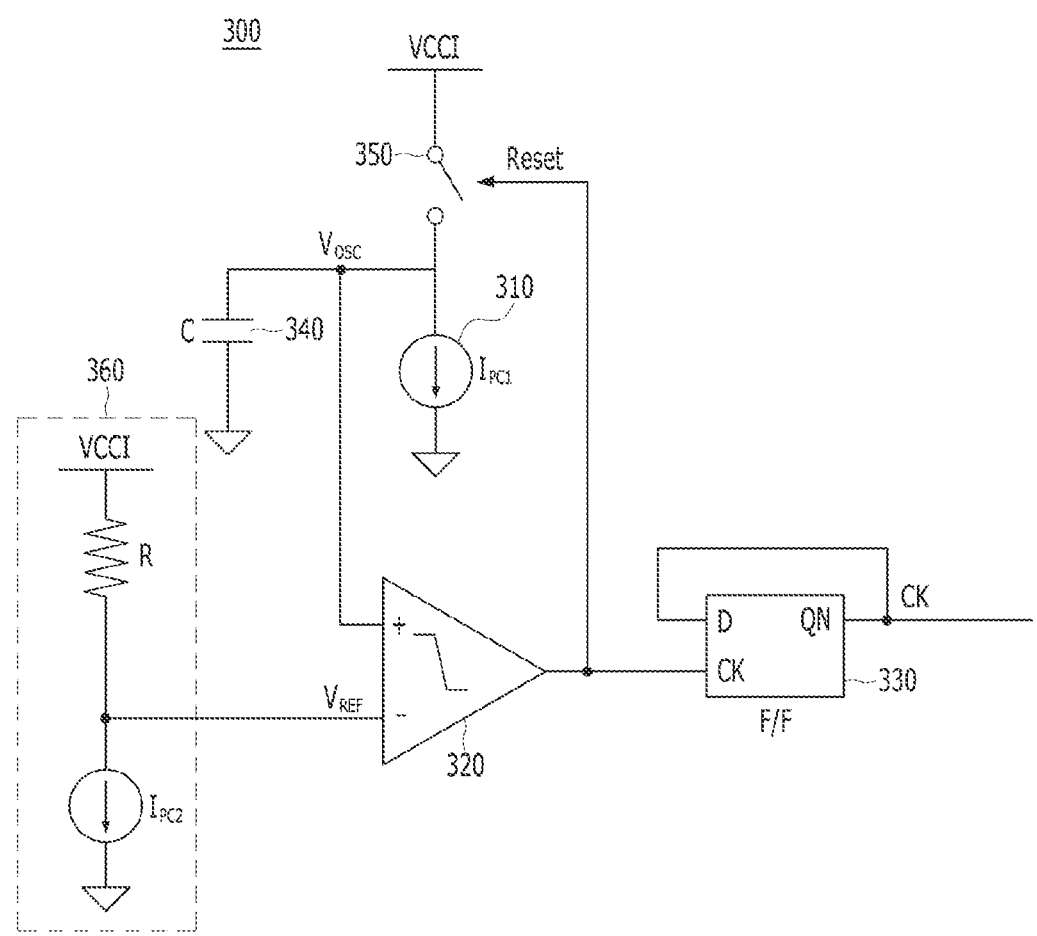
FIG. 10 illustrates a dock signal generator according to another embodiment of the present disclosure.

FIG. 10 illustrates a clock signal generator according to another embodiment of the present disclosure.

Referring to FIG. 10, the clock signal generator 300 can include some components which are similar to those included in the clock signal generator 100 described in FIG. 3. The clock signal generator 300 can use a relaxation oscillator to generate the clock signal CLK used in the memory system 10 or the like described with reference to FIG. 1, For example, when the internal power supply voltage VCCI is applied to the clock signal generator 300, a current can flow through an enable element 350 and a first current source $I_{PC1}$ 310, An oscillation voltage $V_{OSC}$ can be generated at a node connected to a capacitor C 340.

The comparator 320 can compare the oscillation voltage $V_{OSC}$ with the reference voltage $V_{REF}$ to output a comparison result. The enable element 350 can be turned off or on by a reset signal Reset corresponding to the comparison result output from the comparator 320. Further, the comparison result of the comparator 320 can be input to the clock terminal CK of the flip-flops (F/F) 330. Because the input terminal D and the output terminal QN of the flip-flop (F/F) 330 are connected to each other through a feedback loop, the flip-flop (F/F) 330 can repeatably invert an output to result in response to the comparison result of the comparator 320. For example, an output result CK of the flip-flop (F/F) 330 can be repeatably changed from a logic low level to a logic high level, or vice versa. The output result CK can be used as the clock signal CLK.

The clock signal generator 300 can include a reference voltage generator 360 that generates a reference voltage VREF input to the comparator 320. The reference voltage generator 360 can include a resistor R and a second current source $I_{PC2}$ between the internal power supply voltage VCCI and the ground voltage. A detailed configuration of the reference voltage generator 360 is described with reference to FIG. 11, FIG. 11 illustrates an example of a reference current generator shown in FIG. 10.

Figure 11:
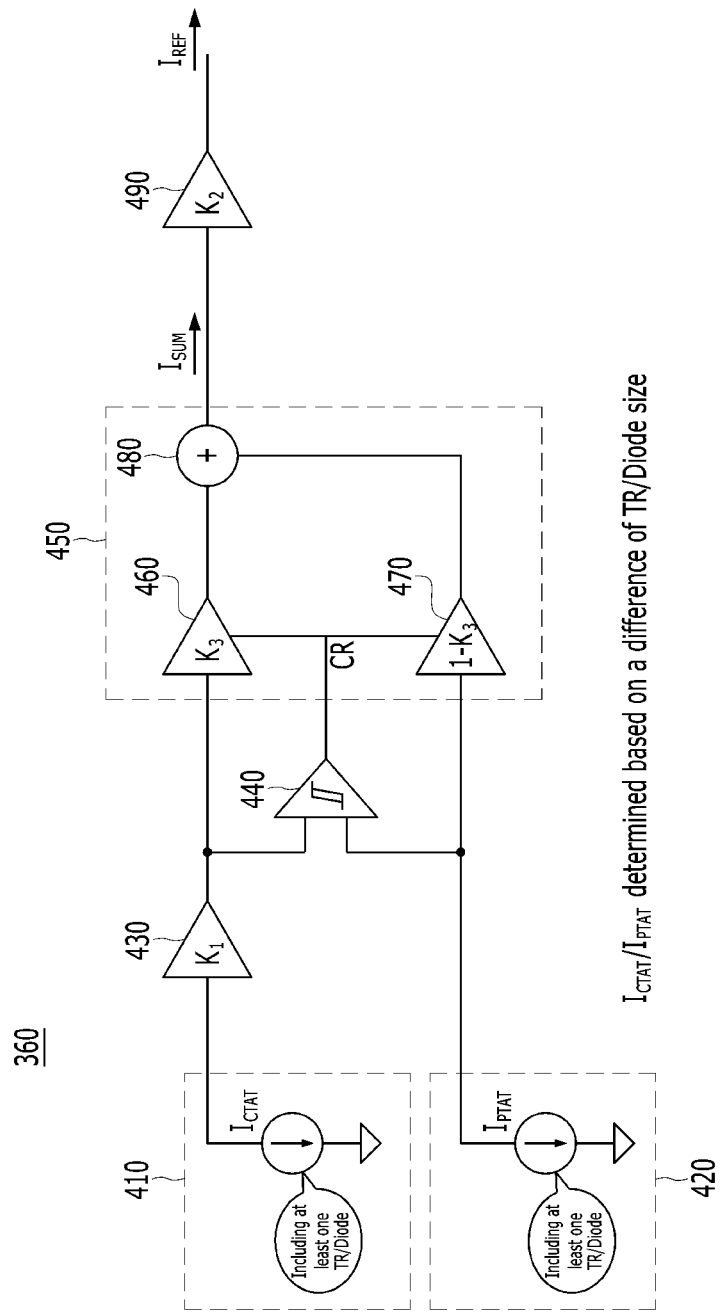
FIG. 11 illustrates an example of a reference current generator shown in FIG. 10.

Referring to FIG. 11, the reference current generator 360a can include a plurality of current sources 410, 420 having different temperature coefficients, each current source generating a different current. A third current source 410 can generate a third current $I_{CTAT}$ having a characteristic insensitive to the level of the power supply voltage and complementary to absolute temperature (CTAT). A fourth current source 420 can generate a fourth current $I_{PTAT}$ having a characteristic insensitive to the level of the power supply voltage and proportional to absolute temperature (PTAT). For example, each current source can include at least one diode, diode-connected transistor, or bipolar junction transistor (BIT) coupled between a power supply voltage and a ground voltage. In an embodiment, the third and fourth current sources 410, 420 can individually include at least one diode, diode-connected transistor, or bipolar junction transistor (BIT), which has different characteristics for the temperature change. For example, components included in the third and fourth current sources 410, 420 can have different sizes.

The reference current generator 360a can include a first trimmer 430 that adjusts an amount of the third current $I_{CTAT}$. The first trimmer 430 can adjust the amount of the third current $I_{CTAT}$ to be equal to an amount of the fourth current $I_{PTAT}$ at a first temperature by applying a first weight $W_1$ to the third current $I_{CTAT}$. For example, corresponding to a design of the reference current generator 360a, the first trimmer 430 can reflect a compensation value at a temperature Tcross where the amounts of the first current I_PTAT and the second current I_CTAT are the same.

The reference current generator device 360a can include a comparator 440 that compares third current $I_{CTAT}$ output through the first trimmer 430 with the fourth current $I_{PTAT}$ output from the fourth current source 420. The comparator 440 can compare the amounts of the third current $I_{CTAT}$ and the fourth current $I_{PTAT}$ to output a comparison result CR, The comparison result CR can be used as an indicator or flag for confirming whether adjustment of the third current $I_{CTAT}$ output through the first trimmer 430 at the first temperature is completed.

Further, the reference current generator 360a can include a mixer 450 capable of combining or summing the third current $I_{CTAT}$ and the fourth current $I_{PTAT}$. The mixer 450 may include a combiner 480 for combining or summing the third current $I_{CTAT}$ and the fourth current $I_{PTAT}$. Meanwhile, the mixer 450 does not simply combine or add the third current $I_{CTAT}$ and the fourth current $I_{PTAT}$ to each other at a second temperature which is different from the first temperature. In the mixer 450, different third weights (e.g., $W_3$, $1-W_3$) can be applied to the third current $I_{CTAT}$ and the fourth current $I_{PTAT}$, so that the amounts of the third current $I_{CTAT}$ and the fourth current $I_{PTAT}$ are the same. Then, the third current $I_{CTAT}$ and the fourth current $I_{PTAT}$ can be combined. For these adjustments, the mixer 450 can include a second trimmer 460 capable of adjusting an amount of the third current $I_{CTAT}$ at the second temperature and a third trimmer 470 capable of adjusting an amount of the fourth current $I_{PTAT}$ at the second temperature.

According to an embodiment, the second trimmer 460 and the third trimmer 470 can determine in what ratio to combine the third current $I_{CTAT}$ and the fourth current $I_{PTAT}$ e.g., what proportion of the third current $I_{CTAT}$ and the fourth current $I_{PTAT}$ would account for in the combined current $I_{SUM}$ of the third current $I_{CTAT}$ and the fourth current $I_{PTAT}$), For example, if the second trimmer 460 adjusts a proportion of the third current $I_{CTAT}$ to 70% ($W_3$), the third trimmer 470 can adjust a proportion of the fourth current $I_{PTAT}$ to 30% (=100%-70%) ($1-W_3$). In another example, when the second trimmer 460 adjusts the proportion of the third current $I_{CTAT}$ to 45%, the third trimmer 470 can adjust the proportion of the fourth current $I_{PTAT}$ to 55% (=100%-45%.

The reference current generator 360a can include a fourth trimmer 490 for adjusting the combined current $I_{SUM}$ of the third current $I_{CTAT}$ and the fourth current $I_{PTAT}$ output from the mixer 450 in response to the change of temperature. According to an embodiment, the fourth trimmer 490 can adjust the combined current $I_{SUM}$ of the third current $I_{CTAT}$ and the fourth current $I_{PTAT}$ at a third temperature which is different from the first temperature and the second temperature by applying a second weight $W_2$ to the combined current $I_{SUM}$. The current output from the fourth trimmer 490 can be used as the reference current $I_{REF}$ by the dock signal generator 300. Thus, the current output from the fourth trimmer 490 could have a constant current amount suitable for the dock signal generator 300. For example, when the dock signal generator 300 is designed to generate a clock signal based on a preset current amount of the reference current $I_{REF}$, the current output from the fourth trimmer 490 can have the preset current amount.

As described above, the reference current generator 360a can include the first trimmer 430 for adjusting the third current $I_{CTAT}$ and the fourth current $I_{PTAT}$ to have the same amounts to compensate for the change of temperature change, as well as apply different weights $K_1$, $K_2$, $K_3$ to the third current $I_{CTAT}$ and the fourth current $I_{PTAT}$ according to the comparison result of the third current $I_{CTAT}$ and the fourth current in $I_{PTAT}$ the process of combing or summing the combined current $I_{SUM}$ of the third current $I_{CTAT}$ and the fourth current $I_{PTAT}$. Also, the reference current generator 360a can further adjust the combined current $I_{su}$m of the third current $I_{CTAT}$ and the fourth current $I_{PTAT}$ to compensate for the change of temperature. The reference current generator 360a described in FIG. 11, in an embodiment, can output a reference current $I_{REF}$ having a constant amount even with the change of temperature and the change of process through three-step adjustments, so that a more accurate reference current $I_{REF}$ can be supplied to the dock signal generator 300.

Figure 12:
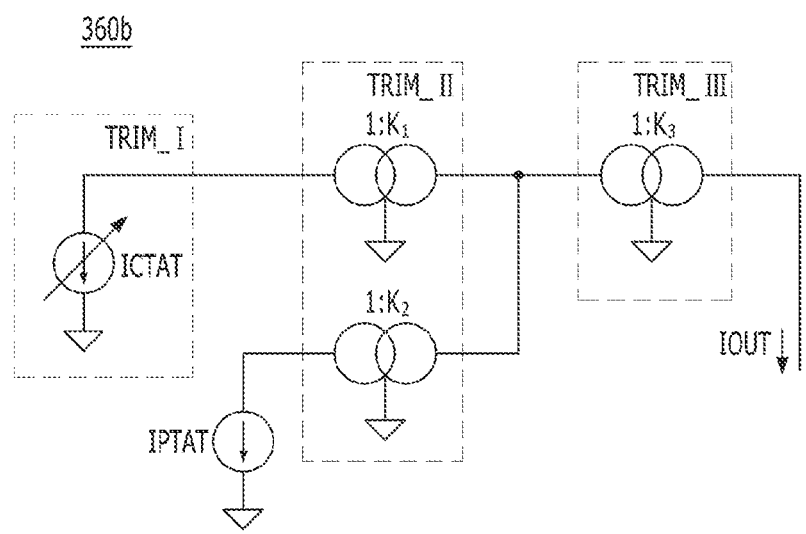
FIG. 12 illustrates another example of the reference current generator shown in FIG. 10.

FIG. 12 illustrates another example of the reference current generator shown in FIG. 10.

Referring to FIG. 12, the reference current generator 360b can perform the three-step adjustment regarding the third current $I_{CTAT}$ and the fourth current $I_{PTAT}$, In the three steps of adjustments TRIM_I, TRIM_II, TRIM III for the third current $I_{CTAT}$ and the fourth current $I_{PTAT}$, magnifications $1:K_1$, $1:K_2$, $1:K_3$ applied in each step can be independently determined. For example, the magnifications $1:K_1$, $1:K_2$, $1:K_3$ of the third current $I_{CTAT}$ and the fourth current $I_{PTAT}$ can be differently adjusted for each step in different operational environments (e.g., different temperatures). The magnifications $1:K_1$, $1:K_2$, $1:K_3$ can be determined in advance through a test on an operation of the reference current generator 360b. Herein, $K_1$, $K_2$, and $K_3$ can be a positive number. When $K_1$, $K_2$, or $K_3$ is less than 1, the third current $I_{CTAT}$ or the fourth current $I_{PTAT}$ can be adjusted to decrease an amount thereof. Or, when $K_1$, $K_2$, or $K_3$ is greater than 1, an amount of the to third current $I_{CTAT}$ or the fourth current $I_{PTAT}$ can be adjusted to increase an amount thereof. In an embodiment, the output current $I_{OUT}$ output from the reference current generator 360b can have a constant amount by compensating for the change of temperature.

Figure 13:
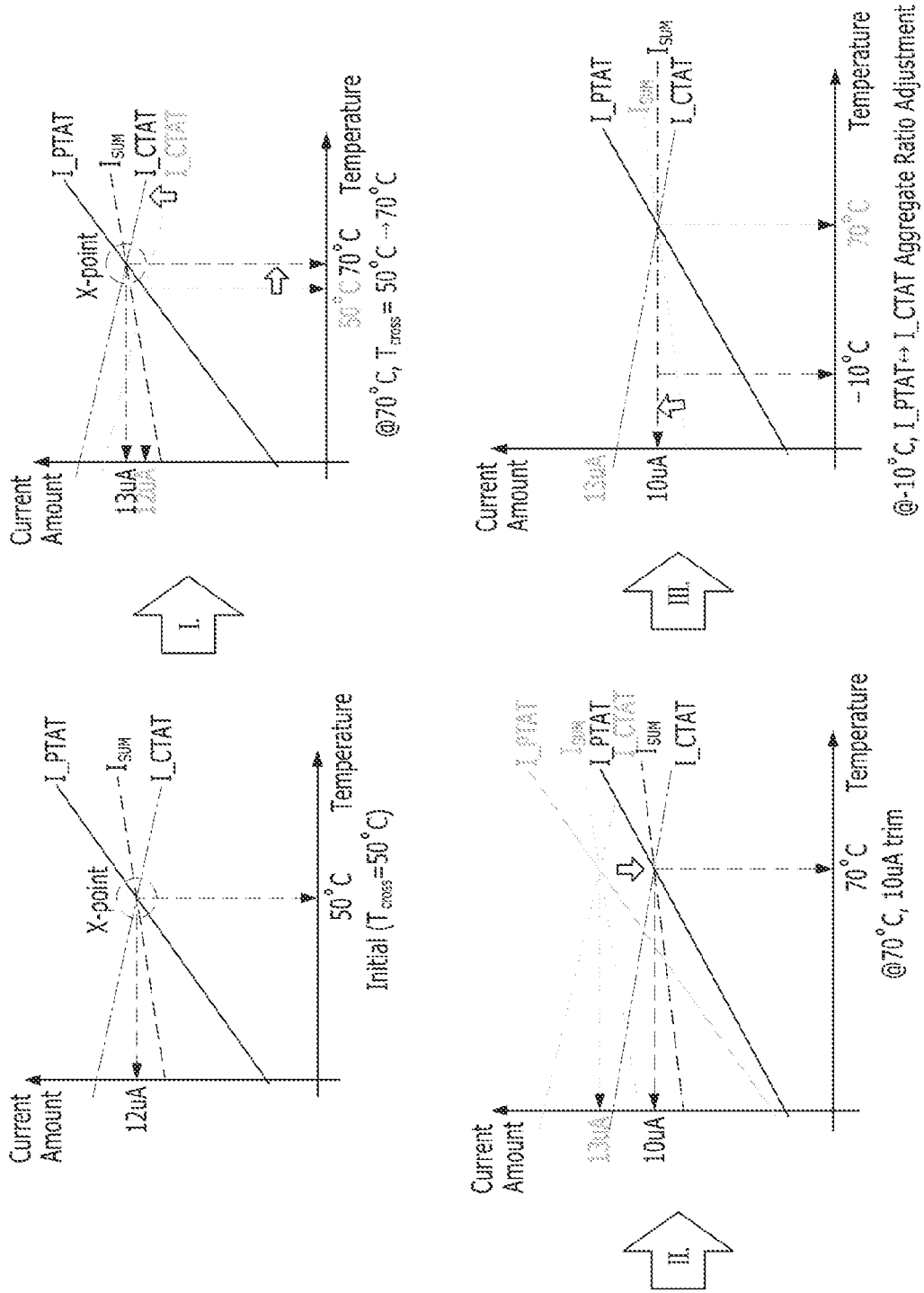
FIG. 13 illustrates an effect corresponding to a temperature change in an operation of the reference current generator shown in FIG. 10.

FIG. 13 illustrates an effect corresponding to a temperature change in an operation of the reference current generator shown in FIG. 10.

Referring to FIG. 13, the effect of the three-step adjustment in the reference current generator 360a, 360b regarding compensation according to the change of temperature change is shown. First, characteristics or tendency according to the change of temperature after the reference current generator 360a, 360b is fabricated or manufactured may be checked or monitored. For example, regarding a first characteristic according to the change of temperature, the amounts of the third current $I_{CTAT}$ and the fourth current $I_{PTAT}$ are the same (e.g., 12 µA) at a specific temperature (e.g., 50 degrees).

Through a first-step adjustment (I) of adjusting the amount of the third current $I_{CTAT}$, characteristics of the reference current generator 360a, 360b with respect to the change of temperature can be checked at a different temperature. For example, in a temperature (e.g., 70 degrees), the third current $I_{CTAT}$ and the fourth current $I_{PTAT}$ can have the same amount of 13 µA.

Thereafter, through a second-step adjustment (II) in which to different weight are applied to the third current $I_{CTAT}$ and the fourth current $I_{PTAT}$, the reference current generator 360a, 360b can adjust the third current $I_{CTAT}$ and the fourth current $I_{PTAT}$ with respect to the change of temperature. For example, at the temperature (e.g., 70 degrees), the amounts of the third current $I_{CTAT}$ and the fourth current $I_{PTAT}$ can be made equal to 10 µA.

Thereafter, through a third-step adjustment (III) of the combined current $I_{SM}$ of the third current $I_{CTAT}$ and the fourth current $I_{PTAT}$, the reference current generating device 360a, 360b can adjust the third current $I_{CTAT}$ and the fourth current $I_{PTAT}$ with respect to the change of temperature. For example, at minus 10 degrees Celsius (−10° C.), the combined current $I_{SUM}$ of the third current $I_{CTAT}$ and the fourth current $I_{PTAT}$ can be adjusted to be 10 µA.

Through the three-step adjustment I, II, III described above, the reference current generator can output the combined current $I_{SUM}$ of 10 µA in a range of operational temperature (e.g., minus 10 degrees to minus 70 degrees).

In a general reference current generator, operational characteristics at plural temperatures are checked, compensation values at the plural temperatures are determined, and the compensation values are used, as it is, for compensating for the change of temperature. However, according to an embodiment of present disclosure, the three-step adjustment can determine a compensation value for the change in a wide to temperature range by monitoring or checking operational characteristics of the reference current generator at several representative sampling temperatures. Accordingly, in the embodiment, a test for checking or monitoring operational characteristics of the reference current generator at tens or hundreds of different temperatures might be not necessary. In an embodiment, a test time of the reference current generator can be reduced because the test might be not performed at tens or hundreds of different temperatures in an operable temperature range.

As above described, a semiconductor device according to an embodiment of the present disclosure can compensate for the change of temperature in a low power voltage environment.

The semiconductor device according to an embodiment of the present disclosure can support a memory system or a data processing system to perform a stable data input/output operation even though a temperature inside of the memory system or the data processing system is changed or fluctuated.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A bandgap reference circuit, comprising:
a plurality of current sources comprising different temperature coefficients;
a first trimmer configured to adjust a current amount of one among a plurality of currents, which are individually output from each of the plurality of current sources, to be equal to that of another among the plurality of currents;
a comparator configured to compare an adjusted current output from the first trimmer with the another among the plural current sources, wherein an adjustment, performed by the first trimmer, for the one among the plurality of currents is monitored at a first temperature based on a comparison result of the comparator; and
a mixer configured to adjust current amounts for the plurality of currents at a second temperature, which is different from the first temperature, to be equal to each other to determine an aggregate ratio and combine the plurality of currents based on the aggregate ratio.

2. The bandgap reference circuit according to claim 1, wherein the plurality of current sources comprise:
a first current source configured to decrease a current amount of a first current among the plurality of currents; and
a second current source configured to increase a current amount of a second current among the plurality of currents.

3. The bandgap reference circuit according to claim 2, wherein the first current source comprises plural diodes, plural diode-connected transistors, or plural bipolar junction transistors (BJTs), and
the second current source outputs a difference between currents flowing through two components having different sizes in the first current source.

4. The bandgap reference circuit according to claim 2, wherein the first trimer adjusts an amount of the first current output from the first current source.

5. The bandgap reference circuit according to claim 1, wherein the mixer comprises:
a second trimer configured to adjust a current amount of the first current at the second temperature;
a third trimer configured to adjust a current amount of the second current at the second temperature; and
a combiner configured to combine outputs of the second trimer and the third trimer.

6. The bandgap reference circuit according to claim 1, further comprising:
a fourth trimer configured to adjust a current amount of current output from the mixer based on a preset reference.

7. A clock signal generator, comprising:
a bandgap reference circuit comprising:
a first trimmer configured to adjust a current amount of one among a plurality of currents, which are individually output from each of a plurality of current sources having different temperature coefficients, to be equal to that of another among the plurality of currents;
a comparator configured to compare an adjusted current with another among the plurality of currents, and
a mixer configured to adjust current amounts for the plurality of currents at a second temperature to be equal to each other to determine an aggregate ratio and combine the plurality of currents based on the aggregate ratio to output a combined current as a reference current,
wherein an adjustment, performed by the first trimmer, for the one among the plurality of currents is monitored at a first temperature, which is different from the second temperature, based on a comparison result of the comparator;
and
an oscillator configured to generate a clock signal based on the reference current.

8. The clock signal generator according to claim 7, wherein the plurality of current sources comprise:
a first current source configured to decrease a current amount of a first current among the plurality currents; and
a second current source configured to increase a current amount of a second current among the plurality of currents.

9. The clock signal generator according to claim 7, wherein the mixer comprises:
a second trimer configured to adjust a current amount of the first current at the second temperature;
a third trimer configured to adjust a current amount of the second current at the second temperature; and
a combiner configured to combine outputs of the second trimer and the third trimer.

10. The clock signal generator according to claim 9, wherein the bandgap reference circuit further comprises:
a fourth trimer configured to adjust a current amount of current output from the mixer based on a preset reference.

11. A power circuit, comprising:
a bandgap reference circuit comprising:
a first trimmer configured to adjust a voltage level of one among a plurality of voltages, which are individually output from each of a plurality of voltage sources having different temperature coefficients, to be equal to that of another among the plurality of voltages, a comparator configured to compare an adjusted voltage with another among the plurality of voltages, and a mixer configured to adjust voltage levels for the plurality of voltages at a second temperature to be equal to each other to determine an aggregate ratio and combine the plurality of voltages based on the aggregate ratio to output a combined voltage as a reference voltage, wherein an adjustment, performed by the first trimmer, for the one among the plurality of voltages is monitored at a first temperature, which is different from the second temperature, based on a comparison result of the comparator;

and a regulator configured to receive an external power voltage to generate an internal power supply voltage based on the reference voltage.

12. The power circuit according to claim 11, wherein the plurality of voltage sources comprise:

a first voltage source configured to decrease a voltage level of a first voltage among the plurality of voltages; and a second voltage source configured to increase a voltage level of a second voltage among the plurality of voltages.

13. The power circuit according to claim 11, wherein the mixer comprises:

a second trimer configured to adjust a voltage level of the first voltage at the second temperature;

a third trimer configured to adjust a voltage level of the second voltage at the second temperature; and a combiner configured to combine outputs of the second trimer and the third trimer.

14. The power circuit according to claim 13, wherein the bandgap reference circuit further comprises:

a fourth trimer configured to adjust a voltage level of voltage output from the mixer based on a preset reference.

15. The power circuit according to claim 11, further comprising:

a voltage sensor configured to monitor whether a voltage level of the internal power supply voltage is below a present level.

* * * * *